(12) United States Patent
Yuh et al.

(10) Patent No.: US 8,693,273 B2
(45) Date of Patent: Apr. 8, 2014

(54) REFERENCE AVERAGING FOR MRAM SENSE AMPLIFIERS

(75) Inventors: Perng-Fei Yuh, San Jose, CA (US); Po-Kang Wang, Los Altos, CA (US); Lejan Pu, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 122 days.

(21) Appl. No.: 13/345,116

(22) Filed: Jan. 6, 2012

(65) Prior Publication Data

US 2013/0176773 A1  Jul. 11, 2013

(51) Int. Cl.
*G11C 7/02* (2006.01)

(52) U.S. Cl.
USPC ............................ 365/207; 365/148; 365/158

(58) Field of Classification Search
USPC .......................................... 365/148, 158, 207
See application file for complete search history.

(56) References Cited

U.S. PATENT DOCUMENTS

| | | | |
|---|---|---|---|
| 6,700,814 B1 | 3/2004 | Nahas et al. | |
| 6,822,895 B2 | 11/2004 | Yamada | |
| 7,038,959 B2 | 5/2006 | Gami | |
| 7,113,437 B2 | 9/2006 | Schweickert et al. | |
| 7,167,389 B2 | 1/2007 | Iwata | |
| 7,239,537 B2 | 7/2007 | DeBrosse et al. | |
| 7,596,045 B2 | 9/2009 | DeBrosse et al. | |
| 2003/0103395 A1* | 6/2003 | Ooishi | 365/201 |
| 2004/0090841 A1 | 5/2004 | Pemer et al. | |
| 2004/0120200 A1 | 6/2004 | Gogl et al. | |
| 2005/0083747 A1* | 4/2005 | Tang et al. | 365/210 |
| 2007/0242549 A1 | 10/2007 | Klostermann et al. | |
| 2009/0010045 A1* | 1/2009 | Ueda | 365/158 |
| 2009/0086534 A1 | 4/2009 | DeBrosse et al. | |
| 2010/0061144 A1* | 3/2010 | Davierwalla et al. | 365/158 |
| 2010/0302838 A1* | 12/2010 | Wang et al. | 365/158 |
| 2011/0176350 A1* | 7/2011 | Jung et al. | 365/148 |
| 2011/0188305 A1* | 8/2011 | Yang | 365/171 |
| 2011/0194361 A1 | 8/2011 | Kawahara et al. | |

OTHER PUBLICATIONS

"A 4-Mb 0.18-um 1T1MTJ Toggle MRAM With Balanced Three Input Sensing Scheme and Locally Mirrored Unidirectional Write Drivers," by Thomas W. Andre et al., IEEE Journal of Solid-State Circuits, vol. 40, No. 1, Jan. 2005, pp. 301-309.
"A 0.24-um 2.0-V 1T1MTJ 16-kb Nonvolatile Magnetoresistance RAM With Self-Reference Sensing Scheme," by Gitae Jeong et al., IEEE Journal of Solid-State Circuits, vol. 38, No. 11, Nov. 2003, pp. 1906-1910.
PCT Search Report PCT/US2012/070319 Mail date—Mar. 1, 2013.

* cited by examiner

*Primary Examiner* — Hoai V Ho
(74) *Attorney, Agent, or Firm* — Saile Ackerman LLC; Stephen B. Ackerman

(57) ABSTRACT

A sense amplifier comprising a reference current developed from a programmed and a non-programmed reference cell is used to read a signal from a magnetic random access memory (MRAM) comprising magnetic tunnel junction (MTJ) cells. The average current is determined from reference cells in as few as one sense amplifier and as many as n sense amplifiers, and is an average current between the programmed reference cell and the non-programmed reference cell that approximates the mid point between the two states. The sense amplifier can be fully differential or a non differential sense amplifier.

18 Claims, 4 Drawing Sheets

REFERENCE AVERAGING FOR MRAM SENSE AMPLIFIERS

BACKGROUND OF THE INVENTION

1. Field of Invention

The present invention is related to magnetic random access memory and in particular to reference averaging to enhance the read out margin.

2. Description of Related Art

Information is stored in a magnetic random access memory (MRAM) in the form of parallel and anti-parallel magnetic states of a magnetic tunnel junction (MTJ). The resistance of the parallel state is lower than that of the anti-parallel state. Data is stored in an MTJ by whether the state of the magnetic material of the MTJ is parallel or anti-parallel. Read out of the data in a sense amplifier is current flow from the MTJ compared to a reference that is positioned midway between current flow from an MTJ that has a magnetic parallel state and one that is anti-parallel.

To reduce readout variation and to produce a better fit with the threshold for deciding the state of an MTJ, a constant reference voltage or a constant reference current have been tried, but constant voltage and constant current references usually can not track temperature and process variations of the MTJ cells. These constant references cannot track the parasitic resistance and capacitance in the signal paths. Therefore, constant voltage and current references are not suitable for high speed operation. Self reference scheme have been considered, but it usually requires a cell to be read twice at different time intervals, which causes a longer time interval, charge loss, and possible influence of disturbance.

U.S. Pat. No. 7,239,537 B2 (DeBrosse et al.) is directed to a calibrated magnetic random access memory current sense amplifier, wherein a plurality of trim transistors that are individually activated to compensate for device mismatch relative to the data and sense sides of a sense amplifier. In U.S. Pat. No. 7,167,389 B2 (Iwata.) a magnetic random access memory is directed to a use of reference cells to help facilitate read and write operations. U.S. Pat. No. 7,038,959 B2 (Garni) is directed to a sense amplifier and a method for sensing an MRAM cell, comprising data cells, reference cells and dummy cells. U.S. Pat. No. 6,822,895 B2 (Yamada) is directed to a reference bit line connected in common for a plurality of bit lines, wherein a sense amplifier connected to a bit line and the reference bit line. U.S. Pat. No. 6,700,814 B1 (Nahas et al.) is directed to the use of a mock MRAM array and a mock sense amplifier, wherein a control circuit maintains current through cells of the mock MRAM at a value proportional to a reference current through variations in average bit cell resistance.

An article by Thomas W. Andre, Joseph J Nahas, Chita K. Subramanian, Bradley J Garni, Halbert S. Lin, Asim Omar and William L. Martino, Jr. titled "A 4 Mb 0.18 um 1T1MTJ Toggle MRAM With Balanced Three Input Sensing Scheme And Locally Mirrored Unidirectional Write Drivers", IEEEE Journal of Solid State Circuits, vol. 40, pp. 301-309, January 2005, is directed a five level CMOS technology with a single toggling magneto tunnel junction to achieve a small chip size using unidirectional programming currents controlled by mirrored write drivers and a balanced three input current mirror sense amplifier for a read operation. An article by Gitae Jeong, Wootoung Cho, Sujin Ahn, Hongsik Jeong, Gwanhyeob Koh, Youngnam Hwang and Kinam Kim, titled "A 0.24 um 2.0 V 1t1MTJ 16 Kb Nonvolatile Magnetoresistance RAM With Self Reference Sensing Scheme", IEEE Journal of Solid State Circuits, vol. 38, pp. 1906-1910, November 2003, is directed to a one transistor and one magnetic-tunnel-junction magneto resistance RAM using a self reference sensing scheme for reliable sensing margin.

SUMMARY OF THE INVENTION

It is an objective of the present invention to generate a reference current for an MRAM sense amplifier by averaging a plurality of at least two sense amplifier reference cells.

It is further an objective of the present invention to provide a differential sense amplifier for use with a single MTJ MRAM.

It is still further an objective of the present invention that the differential sense amplifier comprises an improved reference averaging scheme obtained by averaging the reference currents.

It is also still further an objective of the present invention to produce reference averaging over one word of n bits.

In the present invention a sense amplifier for a magnetic random access memory (MRAM) comprising a plurality of magnetic tunnel junction (MTJ) cells is described. The MTJ cells have two states, a parallel magnetic state and an anti-parallel magnetic state. Information is stored in the form of the two magnetic states. The resistivity of the MTJ cell when in the parallel state is lower than the resistivity in the anti-parallel state. Thus by reading current through the MTJ cell, a sense amplifier can determine which state and therefore what information is stored in the MTJ cell.

To determine of which magnetic state the MTJ cell is in, a reference current must be applied to the sense amplifier. If the reference current is a fixed bias applied to the sense amplifier, the effects of process variation and temperature on the circuitry will not be taken into consideration as well as circuit parasitic effects. These variation effects can be partially overcome by using two reference cells, one reference cell having a parallel magnetic alignment and a relatively low resistance Rp, and the other reference cell having an anti-parallel magnetic alignment and a relatively higher resistance Rap. Ideally, a combination of the currents from the two references can be used to produce a reference current that is midway between the current for the parallel aligned reference cell and the current for the anti-parallel reference cell. However, localized process and temperature variations can skew the combination of the two currents in favor of one state or another. To overcome the skewing of the reference current caused by effects of localized process and temperature variation, the current for the parallel aligned and anti-parallel aligned reference cells is done over two sense amplifier data words for 2n MTJ cells. This broader averaging has a tendency to smooth out local variations and produce a reference current that is closer to the midpoint between the parallel aligned reference cell and the anti-parallel aligned reference cell.

The averaged reference current can be further fine tuned by adjusting the numbers of parallel aligned and anti-parallel aligned reference cells. This is useful because the sweet spot for reference current depends on the distribution of parallel and anti-parallel current. The best reference level may not be in the midpoint of the parallel aligned cell and the anti-parallel aligned cell. It is also useful for product trimming and MTJ screening to identify weak bit.

In a fully symmetrical differential sense amplifier design, a common mode bias is obtained by averaging the signal and the reference current. As with the non-differential sense amplifier the averaging of reference currents over one or more words of n bits produces a reference current that is close to the ideal midpoint between the current for a parallel aligned cell and an anti-parallel aligned cell.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
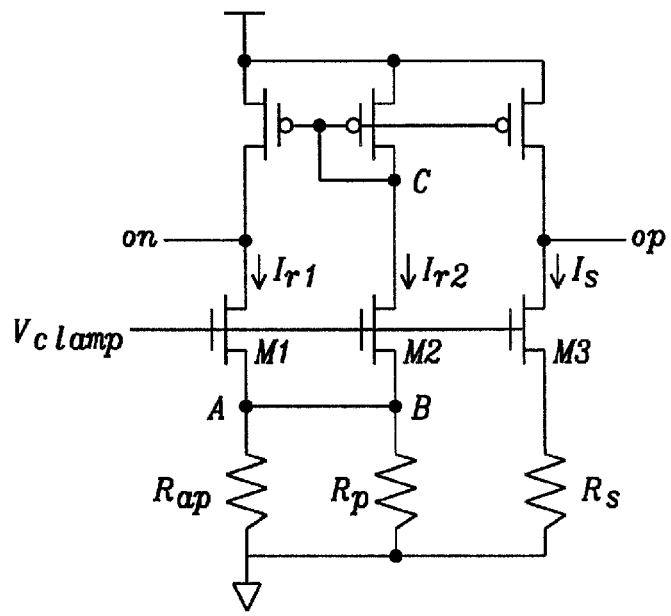
FIG. 1 is a circuit diagram of the present invention for a first approach to reference current averaging for a single MRAM sense amplifier.

An MTJ memory cell has a resistance in the parallel state (Rp) that is lower than the resistance in the anti-parallel state (Rap). A common gate current amplifier is usually used as shown in FIG. 1 to read out the MTJ cells, where "on" and "op" are outputs of the sense amplifier and Rs is the resistive value of the MTJ cell that is being selected. The voltage Vclamp is applied to the gate of clamp transistors M1, M2, and M3. The sources of M1 and M2 are shorted together and connected to two reference cells, one with Rp and one with Rap so that the combined reference current resulting from the shorting $I_{r1}$ and $I_{r2}$ together is a reference current somewhere in the middle of the possible signal current $I_s$, whether $I_s$ is from a parallel state (Rp) or from an anti-parallel state (Rap). The reference current $I_{r2}$ is used for common mode bias, while $I_{r1}$ is used to compare to the signal current $I_s$ flowing through a selected MTJ cell. Currents $I_{r1}$ and $I_{r2}$ are equal in the first order, but they still vary due to different drain voltages.

The sense amplifier margin can be defined as a figure of merit (FM), the signal to variation ratio, defined as:

$$FM=(I_s-I_{r1})/(s(I_s+s(I_{r1})^2)^{1/2} \quad \text{EQ. 1:}$$

where $s(I_s)$ and $s(I_{r1})$ are the standard deviations of the signal current $I_s$ and reference current $I_{r1}$, respectively, assuming Gaussian distribution.

Previously, the reference current in a single MTJ of an MRAM is obtained by averaging current from Rp and Rap so that it will be a mid value. However, the resulting average current is usually not exactly at the midpoint spot of the sensing threshold. Also the reference current still has variation of about $1/(2)^{1/2}$ of the signal variation.

Figure 2:
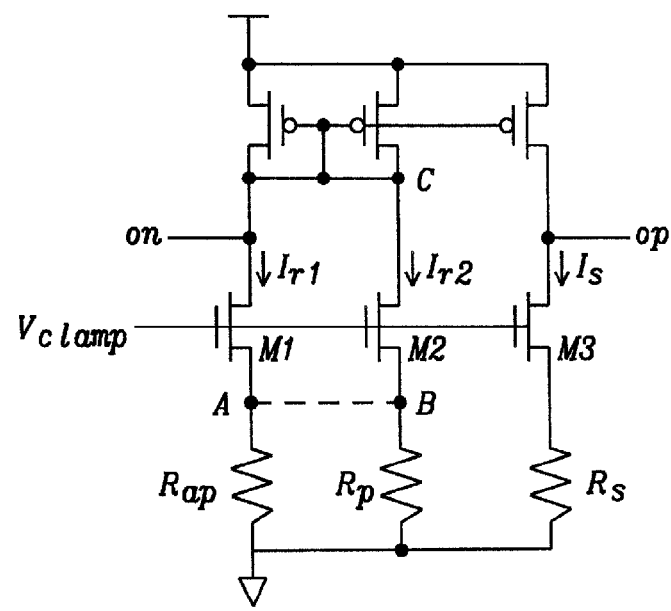
FIG. 2 is a circuit diagram of the present invention for a second approach to reference current averaging for a single MRAM sense amplifier.

A similar sense amplifier design is shown in FIG. 2. where instead of shorting the two source nodes A and B of the clamp transistors, the current averaging is accomplished by connecting a gate and two drains to form node C, which in effect shorts the drains of transistors M1 and M2. This design is not much different than that in FIG. 1 in terms of margin. In order to improve the margin between the reference current and the signal current, a further averaging of the current from reference cells as shown in FIG. 3 can be done.

Figure 3:
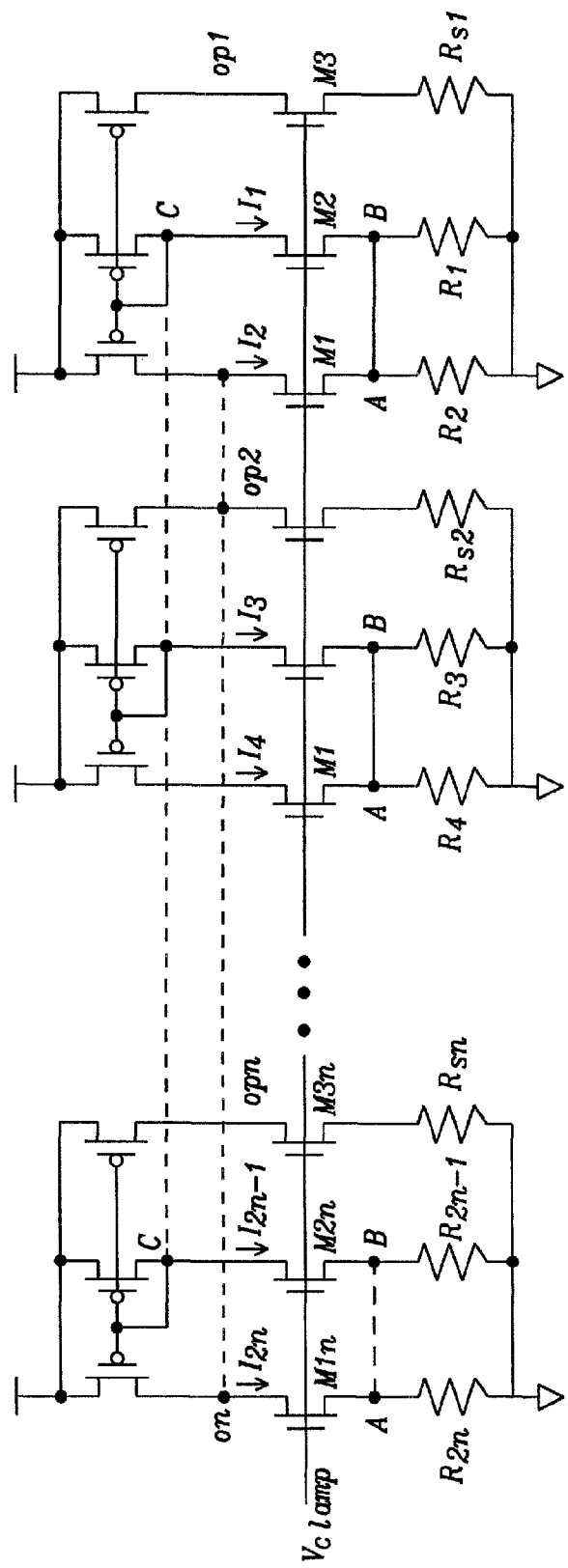
FIG. 3 is a circuit diagram of the present invention for averaging sense amplifier reference current for 2n MTJ cells.

In FIG. 3 is shown the connecting together of nodes shown in FIG. 1 and FIG. 2 for n sense amplifiers resulting in the averaging the resistance of 2n reference MTJ cells and dividing equally the reference current $I_1$ to $I_{2n}$ on the drain side of the clamp transistors M1 and M2 to M1n and M2n. There are three possible ways to perform reference averaging using a traditional sense amplifier.

A first method shown in FIG. 3 is to connect all source nodes A and B of the clamp transistors together for all sense amplifiers. The resistance of 2n MTJ reference cells is averaged together. The total summing current of the 2n MTJ reference cells is divided equally into 2n reference currents $I_1$ to $I_{2n}$ on the drain side of the clamp transistors represented by M1 and M2. The variation in resistance is reduced by a factor of $(2n)^{1/2}$. Parasitic resistances in the paths including wires and switches are also averaged. An advantage of the 2n reference cell averaging scheme is that by changing the number of Rp versus Rap reference cells, the average current can be adjusted.

A second method shown in FIG. 3 is to connect node C, the gate bias for the loading PMOS transistors in each sense amplifier together. The resulting averaging is slightly improved because the random variations caused by the clamp transistors are also include in the averaging of the second method.

A third method of averaging variations in reference currents is to connect the output node "on" in all sense amplifiers together making node "on" the same for all n sense amplifiers and including variations in the PMOS mirror circuits and the NMOS clamp transistors in the averaging.

A combination of the three methods shown in FIG. 3 can be mixed to create 7 different averaging schemes where the signal to variation ratio can be expressed as $$FM=(I_s-I_{r1})/s(I_s) \quad \text{EQ 2:}$$

assuming that $s(I_{ref})=(\frac{1}{2})^{1/2}s(I_s)$, the improvement in signal to variation margin becomes, $FM=(1.5)^{1/2}$.

Figure 4:
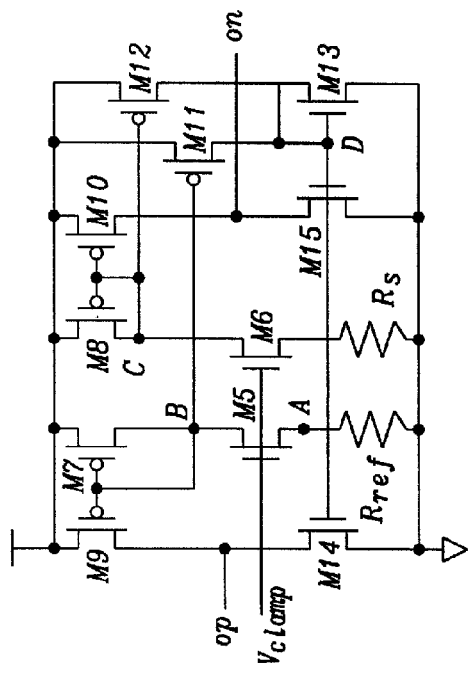
FIG. 4 Is a circuit diagram of the present invention for a fully differential sense amplifier.

Shown in FIG. 4 is a differential sense amplifier for a single MTJ cell. Two clamp transistors M5 and M6 are source connected to an MTJ reference cell and a MTJ memory cell, respectively. The reference cell has a resistance Rref and the memory cell has a resistance Rs. Node A, which is the source of the clamp transistor M5 is a circuit node that can be connected to node A in other sense amplifiers as can node B, which is the drain of clamp transistor M5 connected to the MTJ reference cell that has a resistance value Rref. The two PMOS transistors M7 and M8 are diode connected wherein the gate and drain of transistor M7 are connected together to form node B and the gate and drain of transistor M8 are connected together to form node C. The currents of transistors M7 and M8 are mirrored to transistors M9 and M10 respectively to provide gain, and the currents of transistors M7 and M8 are mirrored to transistors M11 and M12, respectively, and summed on node D with a diode connected transistor M13 to form a common mode bias for transistors M14 and M15, which control the output signals OP and ON respectively.

Figure 5:
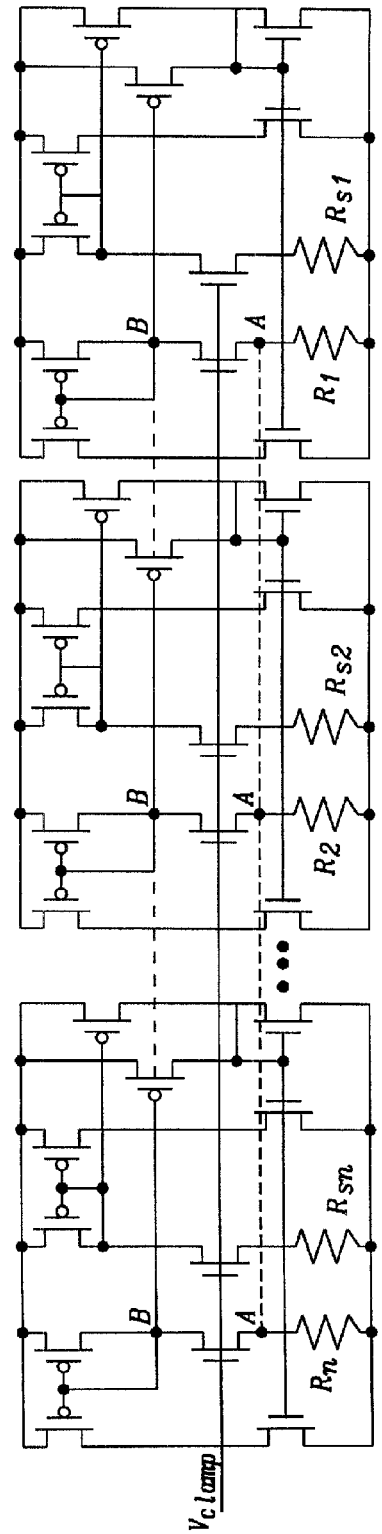
FIG. 5 Is a circuit diagram of the present invention for averaging reference current of a fully differential sense amplifier over one or more data words.

In FIG. 5 is shown the differential sense amplifier of FIG. 4 connected to n other sense amplifiers to allow reference averaging where nodes A and B, respectively, are shown connected together. The resistors $R_1$ to $R_n$ represent the n reference MTJ cells that have a mixture of parallel $R_p$ and anti-parallel $R_{ap}$ states. The magnetic memory MTJ cells are represented by $R_{s1}$ to $R_{sn}$. There are at least three different methods to provide reference averaging with the differential sense amplifier.

The first method is to connect B nodes of each sense amplifier together, which will average together variations in the reference MTJ cells, parasitic resistance in the reference paths, switches, clamp transistor M5 identified in FIG. 4 and mirror transistor M7 identified in FIG. 4.

The second method is to connect only node A together in each sense amplifier which does not average variations of clamp transistor M5 and mirror transistor M7 identified in FIG. 4. The third method is a combination of methods 1 and 2 where the averaging effects are similar to method 1.

Figure 6:
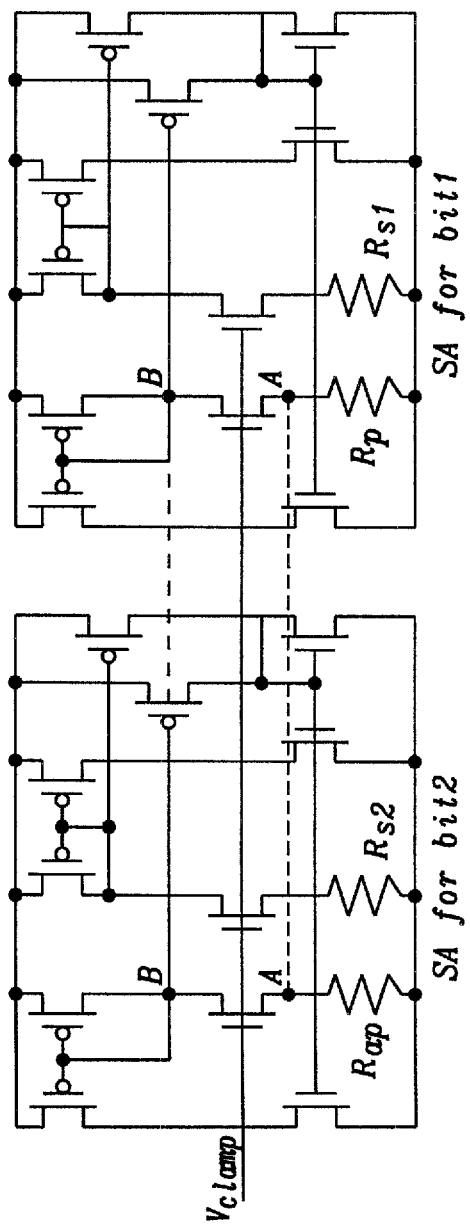
FIG. 6 is a circuit diagram of the present invention for a simple two reference averaging for a fully differential sense amplifier.

The number of reference cells to be averaged can be ranged from two to any large number, for example the length of a word, which can be 38 bits, but other word length such as 16 or 64 bits, plus parity bits, are also practical. The average over a word length is particularly attractive for block read, where all bits in a word are closely placed in one physical location. Sometimes, the bits in a word are scattered among the entire chip. In this case, the two or four reference averaging scheme for the differential sense amplifier shown in FIG. 6. In FIG. 6 is shown the condition of FIG. 5 when n is equal to two. Instead of using two reference cells per bit as in FIG. 1 and FIG. 2, two reference cells are used for two bits where one of the reference cell is a parallel aligned MTJ MRAM cell shown in FIG. 6 as Rp, and the other reference cell is an anti-parallel cell shown as Rap.

While the invention has been particularly shown and described with reference to preferred embodiments thereof, it will be understood by those skilled in the art that various changes in form and details may be made without departing from the spirit and scope of the invention.

What is claimed is:

1. A sense amplifier for reading a magnetic random access memory, comprising:
   a) a data cell capable of producing a data current proportional to data stored in said data cell;
   b) a first two reference cells connected to a first sense amplifier capable of producing a first reference from an averaged current of the first two reference cells, wherein the averaged reference current of the first sense amplifier is formed by coupling together the current paths of the reference cells coupled to the first sense amplifier;
   c) a second two reference cells connected to a second sense amplifier capable of producing a second reference from an averaged reference current of the of the second two reference cells, wherein the averaged reference current of the second sense amplifier is formed by coupling together the current paths of the reference cells of the second sense amplifier;
   d) said first reference capable of being averaged with said second reference by coupling together a node of the reference current paths of the first and second sense amplifiers; and
   e) said averaged first and second reference capable of being compared to the data current from a magnetic memory data cell to determine a logical value stored in said data cell.

2. The sense amplifier of claim 1, wherein said node of said current paths capable of being coupled together to produce an averaged reference current.

3. The sense amplifier of claim 2, wherein said nodes of a programmed and a non-programmed reference cell capable of forming said averaged reference current when connected together, wherein said various nodes comprises:
   a) an output node;
   b) an input node; and
   c) an internal node.

4. The sense amplifier of claim 1, wherein said averaged reference averages effects of various circuit parameters, wherein said effects of the various circuit parameters comprises:
   a) a resistance of the reference cells;
   b) a parasitic resistance of a circuit path of the reference cells; and
   c) a parasitic capacitance of the circuit path of the reference cells.

5. The sense amplifier of claim 1, wherein said averaged reference is capable of being tuned to balance a value of the averaged reference current for product trimming and screening of weak memory cells by changing numbers of parallel and anti-parallel magnetic states of the reference cells.

6. The sense amplifier of claim 1, wherein said first and second reference cells capable of producing currents of 2n MTJ reference cells of n sense amplifiers are averaged together.

7. The sense amplifier of claim 1, wherein said reference capable of producing a reference current is formed by averaging current from as few as two reference cells to as many as 2n reference cells.

8. The sense amplifier of claim 1, wherein said sense amplifier is a symmetrical differential sense amplifier.

9. The sense amplifier of claim 8, wherein said sense amplifier further comprises:
   a) a first stage formed by clamp transistors connected in a common gate configuration capable of producing a reference current from a resistance of a reference cell and capable of producing a data current from a resistance of a data cell;
   b) a second stage formed by load transistors in a diode connected configuration capable of mirroring the reference current and the data current to an output stage;
   c) a third stage formed by output transistors capable of converting the mirrored current to a voltage; and
   d) a fourth stage formed by bias transistors capable of adjusting common mode voltage of the output voltage.

10. The sense amplifier of claim 9, wherein said symmetrical differential sense amplifier is used for a magnetic random access memory (MRAM) and comprises a single magnetic tunnel junction (MTJ) reference cell capable of creating a reference current that is averaged with reference currents of n symmetrical differential sense amplifiers.

11. The sense amplifier of claim 10, wherein said MTJ reference cells are a mixed combination of parallel and anti-parallel magnetic states.

12. A method for reading a magnetic memory cell, comprising:
   a) creating a programmed reference current from a programmed reference cell;
   b) creating a non-programmed reference current from a non-programmed reference cell;
   c) averaging together the programmed reference current and the non-programmed reference current for a plurality of sense amplifiers to produce a mid-reference current, wherein said mid-reference current is formed from coupling together current paths of programmed and non-programmed reference cells for a plurality of sense amplifiers, wherein the number of current paths of programmed reference cells compared to the number of current paths of non-programmed reference cells is adjusted to produce said mid-reference current that is midway between programmed and non-programmed reference current; and d) comparing a memory cell current to the mid-reference current to determine whether said memory cell is programmed.

13. The method of claim 12, wherein said memory cell is a magnetic tunnel junction (MTJ) forming a part of a magnetic memory.

14. The method in claim 12, wherein said programmed reference cell is a magnetic tunnel junction (MTJ) cell comprising a parallel magnetic state with a relatively low resistance.

15. The method in claim 12, wherein said non-programmed reference cell is a magnetic tunnel junction (MTJ) cell comprising an anti-parallel magnetic state with a relatively high resistance.

16. The method of claim 12, wherein said averaging together the programmed reference current and the non-programmed reference current comprises 2n MTJ reference cells in n sense amplifiers.

17. The method of claim 12, wherein said sense amplifier is a differential sense amplifier comprising one magnetic tunnel junction (MTJ) reference cell in which the reference current of the reference cell is averaged with reference cell current for n differential sense amplifiers to produce the mid-reference current to compare against a signal current from said memory cell.

18. The method of claim 17, wherein said MTJ reference cells are a mixed combination of parallel and anti-parallel magnetic states for n differential sense amplifiers.

* * * * *